United States Patent
Lee

(10) Patent No.: US 9,407,203 B2
(45) Date of Patent: Aug. 2, 2016

(54) COMBINED AMPLITUDE-TIME AND PHASE MODULATION

(71) Applicant: Quantumsine Acquisitions Inc., Grand Cayman (KY)

(72) Inventor: Arthur E. Lee, Round Rock, TX (US)

(73) Assignee: Quantumsine Acquisitions Inc., Grand Cayman (KY)

(*) Notice: Subject to any disclaimer, the term of this patent is extended or adjusted under 35 U.S.C. 154(b) by 0 days.

(21) Appl. No.: 14/574,577

(22) Filed: Dec. 18, 2014

(65) Prior Publication Data

US 2015/0194930 A1 Jul. 9, 2015

Related U.S. Application Data

(60) Provisional application No. 61/924,304, filed on Jan. 7, 2014.

(51) Int. Cl.
| | |
|---|---|
| *H03C 5/00* | (2006.01) |
| *H04L 27/36* | (2006.01) |
| *H03C 99/00* | (2006.01) |
| *H04L 27/04* | (2006.01) |
| *H04L 27/20* | (2006.01) |
| *H04L 27/34* | (2006.01) |

(52) U.S. Cl.
CPC ............... *H03C 5/00* (2013.01); *H03C 99/00* (2013.01); *H04L 27/04* (2013.01); *H04L 27/20* (2013.01); *H04L 27/345* (2013.01); *H04L 27/36* (2013.01); *H03C 2200/0029* (2013.01)

(58) Field of Classification Search
CPC .............. H03C 5/00; H03C 3/00; H03C 1/00; H03C 2200/0029; H03C 99/00; H04L 27/0008; H04L 27/04; H04L 27/20; H04L 27/2032

USPC .................. 332/161, 149, 185, 144; 375/300
See application file for complete search history.

(56) References Cited

U.S. PATENT DOCUMENTS

| | | | | |
|---|---|---|---|---|
| 5,093,636 | A * | 3/1992 | Higgins, Jr. | ........... H03F 1/0294 |
| | | | | 332/100 |
| 5,225,795 | A * | 7/1993 | Iinuma | ................ H04L 27/2092 |
| | | | | 332/100 |
| 5,767,750 | A * | 6/1998 | Yamaji | ...................... H03C 1/00 |
| | | | | 332/103 |
| 7,046,741 | B2 | 5/2006 | Brown et al. | |
| 7,978,782 | B2 * | 7/2011 | Rofougaran | .......... H04L 27/122 |
| | | | | 348/725 |
| 8,044,744 | B2 * | 10/2011 | Graham | ................... H03K 7/00 |
| | | | | 329/312 |
| 8,804,874 | B2 * | 8/2014 | Wang | ...................... H03C 5/00 |
| | | | | 375/298 |
| 2003/0016762 | A1 | 1/2003 | Martin et al. | |
| 2006/0198468 | A1 | 9/2006 | Brown et al. | |
| 2008/0043884 | A1 | 2/2008 | Zhu et al. | |

FOREIGN PATENT DOCUMENTS

WO 02/075949 A1 9/2002

OTHER PUBLICATIONS

United States International Searching Authority; International Search Report & Written Opinion for PCT/US2015/010104; 7 pages; Apr. 28, 2015; Alexandria, VA; US.

* cited by examiner

*Primary Examiner* — Ryan Johnson
(74) *Attorney, Agent, or Firm* — Michael Best & Friedrich LLP

(57) ABSTRACT

A method for generating a compound signal wave with one or more substantially sinusoidal waveform(s) containing an encoded digital information combined with a variable phase changing waveform(s) producing a compound sinusoid waveform that includes at least a sine wave that is amplitude-time modulated and at least one phase modulated wave(s).

12 Claims, 12 Drawing Sheets

(ATM Modulation)

(ATM Options for the Positive Cycle)

(ATM Options for the Negative Cycle)

(8 Bit per Symbol ATM Signal)

(Channel Relationship)

(Creating the QSine Complex Modulation Signal)

(QAM 256 Constellation)

(QAM 1024 Constellation)

COMBINED AMPLITUDE-TIME AND PHASE MODULATION

CROSS-REFERENCE TO RELATED APPLICATIONS

This application claims priority to provisional patent application Ser. No. 61/924,304, filed Jan. 7, 2014, and titled "NuSine," which is incorporated herein in its entirety by reference.

FIELD OF INVENTION

The present invention relates generally to data transmission, and more particularly, to sine wave modulation techniques offering increased data transmission rates.

BACKGROUND OF THE INVENTION

Transmission of digital data is typically accomplished from point to point by modulating a sine wave utilized as a carrier wave through modification of one or more of the characteristic properties of the wave amplitude, frequency, and phase.

Amplitude modulation of sine waves has classically been implemented by directly varying the amplitude of the sine wave as a carrier wave in relationship to the source to be transmitted. A typical signal sine wave is characterized by its amplitude, frequency, and phase. Sine waves are used to transmit data over a host of different media. For amplitude modulated (AM) radio, the broadcasted carrier (sine) wave is modulated with voice and a simple AM receiver can separate the voice from the carrier signal with a diode, amplify the voice and play it through a speaker. AM radio suffers from signal noise byproducts that limit the signal range, quality, and reliability. Typically, modulation or other changes to a pure sine wave will cause byproducts including harmonics, side band, reflections and electromagnetic interference.

Direct modulation of sine waves as carrier waves produces significant noise that is difficult to filter. Frequency modulation techniques have typically been implemented by encoding information in a sine wave as a carrier wave by varying the instantaneous frequency of the wave. Phase modulation techniques have typically been implemented by encoding information on a sine wave as a carrier wave by variations in the instantaneous phase of the carrier wave.

Hybrid modulations schemes have been developed and include QAM, SM, and SSB. These hybrid modulation schemes established improved data transmission but still suffered from significant noise and other modulation byproducts that reduce the actual transmission rates and use excess spectrum resources.

Accordingly, improvements are sought in wave modulation encoding of data.

SUMMARY OF THE INVENTION

While the way that the present invention addresses the disadvantages of the prior art will be discussed in greater detail below, in general, the present invention provides novel modulation techniques offering significantly enhanced signal-to-noise ratio (i.e., data-produced energy over the channel noise energy), reduced bandwidth requirements, increased noise immunity in recovering data at a given Bit Error Rate (BER), and improved dynamic control of the modulation process.

Phase/amplitude-time modulation offers significant increases in data transmission rates compared to prior modulation methods/techniques. The new technique can be applied to any frequency and most existing wired and wireless telecommunications infrastructure.

One aspect of the invention features, in some applications, a modulation method for combining amplitude-time and variable phase modulation of a sine wave. The amplitude-time modulation avoids the majority of spurious emissions exhibited by legacy modulation techniques through small phase variation distortions of the sine wave amplitude. In some implementations, the amplitude-time modulation is described as a step-porch distortion based on small per-bit modifications exhibited as step- or porch-like phase changes to the sine wave during amplitude-time modulation.

Legacy modulation schemes are typically limited to a small number of bits of information per cycle due to noise and other modulation byproducts. In contrast, amplitude-time modulation is capable of 1 to n bits per cycle, n being limited only by the communication hardware device architecture, and peak and crossing phases. Each collection of n bits may comprise a bit set located at set phase angles of each wave. Additionally, more bits per cycle can be transmitted with the reduced noise signature of amplitude-time modulation. Typically a 'zero' value bit is represented by no change in the sine wave value and a 'one' value bit is represented by increasing or decreasing (slightly) the sine wave amplitude at a given position on the wave. Classical encoding techniques such as inverting alternate bits and adaptive altering may also be applied to amplitude-time modulation.

Combinations of amplitude-time modulation with reduced noise can increase the density of variable phase shifted signals and allow a plurality of sine wave carriers 1 to n to be placed at pre-determined phase location periods along the sine wave. Placement can be at any location on the wave, where the value of n is depending, e.g., on device hardware architecture, peak and crossing phases, and clock speed. The addition of variable phase modulation of sine waves can be implemented to increase data content within a transmission. Variable phase modulation data can also facilitate additional data bits and/or control bits to improve the amount and security of data transmitted within a given bandwidth.

The amplitude-time modulated sine wave is combined with the 1 to n degrees of variable phase modulation sine wave(s) to form a compound signal wave for communication purposes. The compound signal wave can be formatted, modulated, and transmitted over most any form of communication system. The compound signal wave can then be demodulated and deciphered as typical communications data. Any combination of wired and wireless communications system may benefit from the Phase/amplitude-time modulation techniques.

Phase/Amplitude-time modulation can be employed with classical electronic hardware utilizing lists and look up tables, and with custom devices or software solutions in various applications.

Accordingly, the disclosed Phase/amplitude-time modulation techniques offer significantly enhanced signal-to-noise ratio, reduced bandwidth requirements, increased noise immunity, and improved control of the modulation process.

BRIEF DESCRIPTION OF THE DRAWINGS

A more complete understanding of the present invention may be derived by referring to the detailed description and claims when considered in connection with the Figures, and:

DETAILED DESCRIPTION

The following description is of exemplary embodiments of the invention only, and is not intended to limit the scope, applicability or configuration of the invention. Rather, the following description is intended to provide a convenient illustration for implementing various embodiments of the invention. As will become apparent, various changes may be made in the function and arrangement of the elements described in these embodiments without departing from the scope of the invention as set forth herein. It should be appreciated that the description herein may be adapted to be employed with alternatively configured devices having different components, modulation/demodulation mechanisms and the like and still fall within the scope of the present invention. Thus, the detailed description herein is presented for purposes of illustration only and not of limitation.

Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment.

In accordance with various aspects of the present invention, Phase/amplitude-time modulation of sine waves offers reduced noise and increased data densities. The present invention may be used to efficiently encode data for transmission over communications systems.

Figure 1:
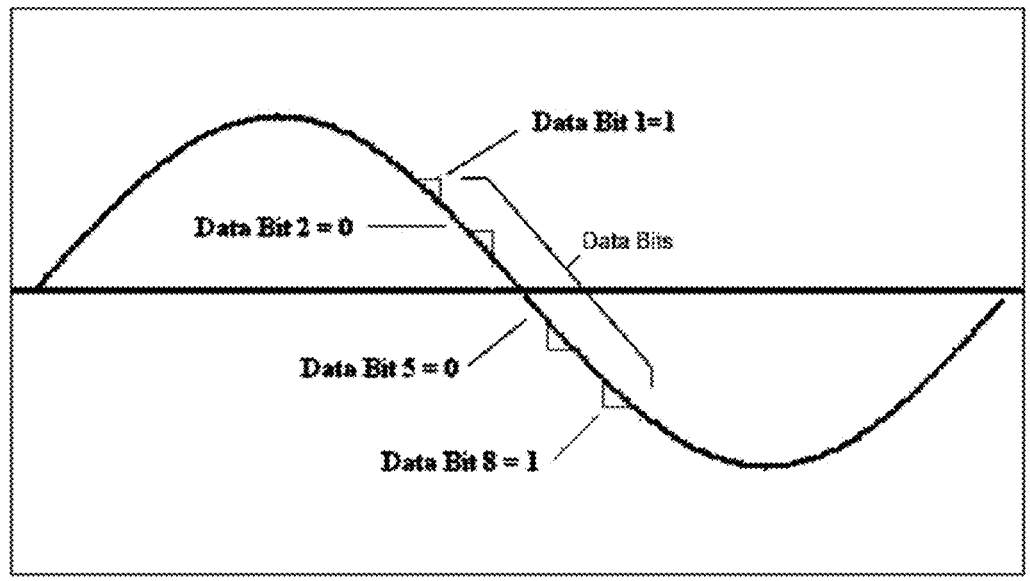
FIG. 1 illustrates a sine wave with digital information encoded through amplitude-time modulation (ATM)

With reference to FIG. 1, a low-distortion, digitally synthesized sine wave is illustrated with data imposed or encoded on this sine wave using a step function characterized by the presence or absence of data bits in the data stream. The digital information can be encoded through amplitude-time modulation displayed as step-porch type wave distortions. In various embodiments, this step function is referred to as Amplitude-Time Modulation ("ATM") or the ATM Component. The step-porch distortions encoding information mitigates signal distortions compared to legacy AM signals. Additional benefits of the reduced distortions include larger word size (1 to n), more data per cycle, and efficient use of the available spectrum A representative sine wave can be generated using a sine lookup table, imposed on a D to A converter.

The novel modulation techniques described herein are referred to as Phase/amplitude time modulation. Phase/amplitude-time modulation further introduces a varying phase, quadrature signal ("Phase Component") that allows data instantiated on the signal to be programmable by the user. Phase/amplitude-time modulation may thus be described in terms of the ATM Component and the Phase Component.

Figure 2:
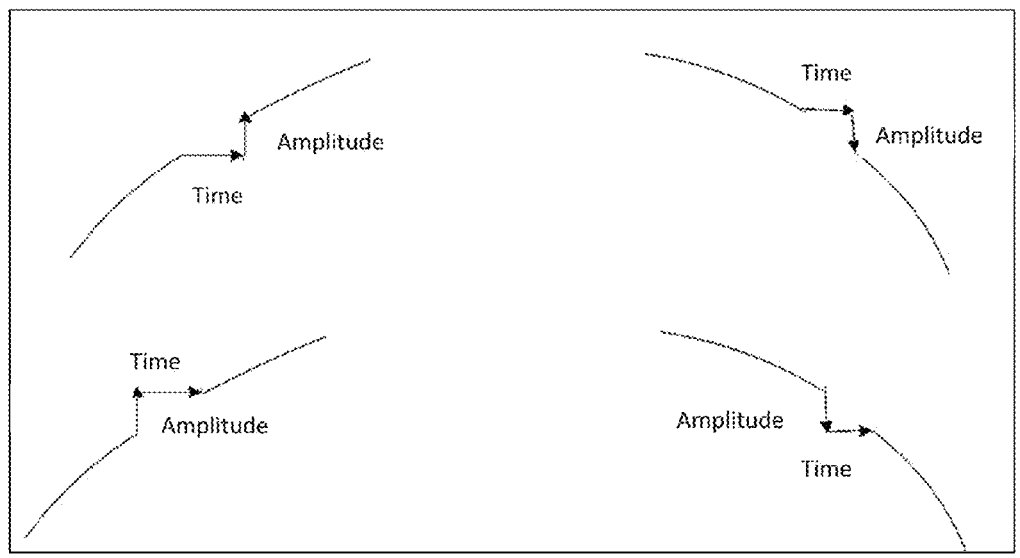
FIG. 2 illustrates positive cycle ATM encoding options.
Figure 3:
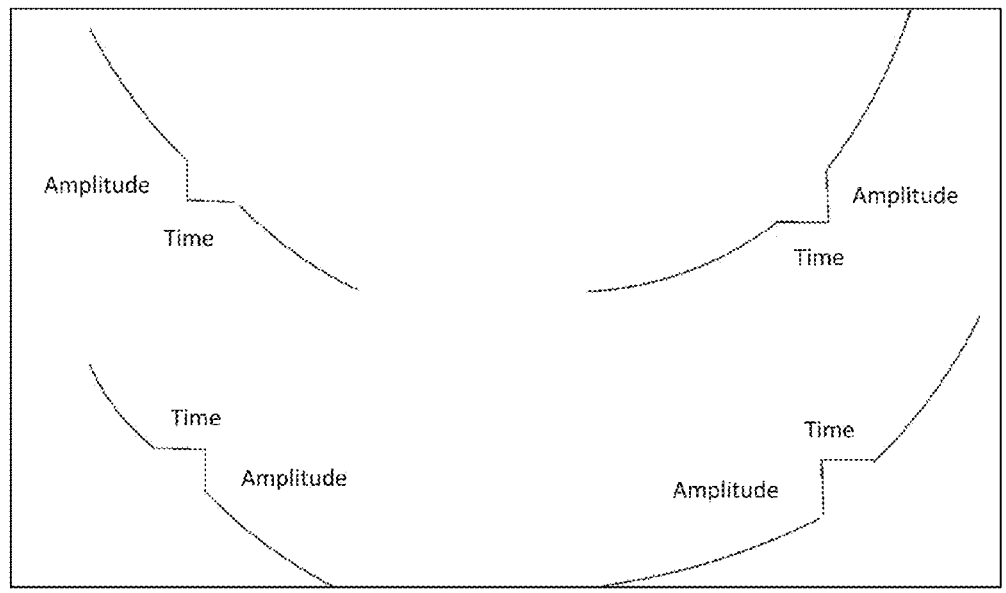
FIG. 3 illustrates negative cycle ATM encoding options.

The primary data channel in Phase/amplitude-time modulation is the ATM modulated sine wave or the ATM Component. In telecommunication, each cycle is commonly referred to as a "Symbol". While, 16 bits per symbol data rates have been achieved on this channel using ATM, higher data rates are anticipated as the technology is further developed. The orientation of the ATM modulation, or the way that the data bit is represented on the ATM sine wave, is fully programmable by the user. FIGS. 2 and 3 illustrate options that can selectively represent either a data value of 1 or 0. Again, the number of bits per symbol, from 1 to n, is variable and selectable by the user, as is the location and orientation of the data.

At a receiver, raw bits of an n-bit word can then be separated from the sine wave, with peaks and valleys representing 0 and 1 data bits controlled by preamble or control word instructions. In addition to the orientation and the number of bits per symbol (Cycle), the location of the bit on the cycle, i.e., the angle on the wave where the bit resides, is also programmable. This raw data can be normalized, conditioned and stored as appropriate.

Figure 4:
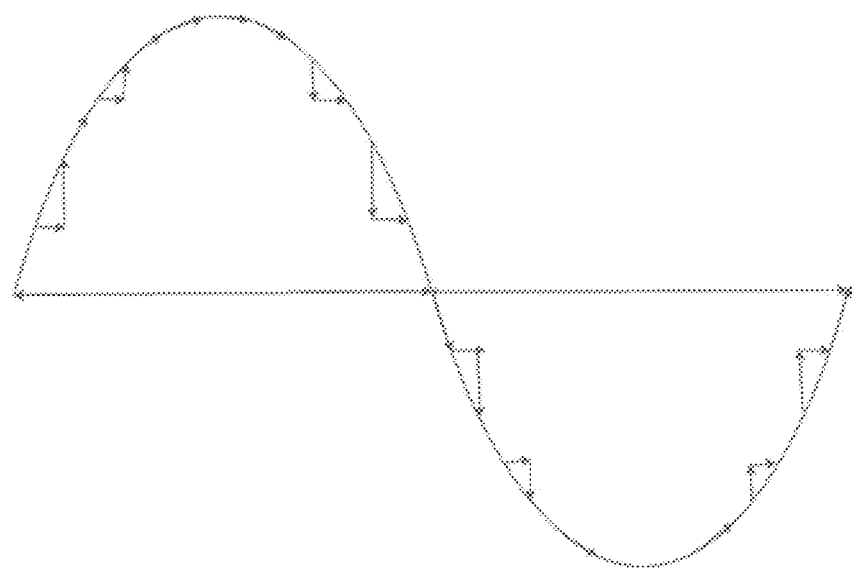
FIG. 4 illustrates an 8 bit per symbol ATM signal.

With reference to FIG. 4, the ATM bit orientation may be selected to represent the value to be encoded. An associated receiver may be informed of this configuration to properly determine the intended value. Finally, the duration of the ATM modulation at each location is also programmable. Note that the bit duration may not overlap the start of the subsequent bit.

Turning now to description of the Phase Component of Phase/amplitude-time modulation, unlike the ATM channel/component that contains actual data values, the Phase/amplitude-time Phase channel/component is a "representation" of either a data value or a control message. This channel in the Phase/amplitude-time modulation scheme is created by the introduction of a phase shift to the ATM channel by summing the two waves. This additional channel allows the value of the phase shift to be used as a way of either adding additional data bits to the symbol or sending control signals between the transmitter and the receiver regarding the format of the ATM channel data. For example, an introduction of a specific phase shift could indicate to the receiver that subsequent ATM channel modulation will indicate that: the orientation of the modulation will be inverted until further notice; the position of the Most Significant Bit (MSB) will be opposite of the current configuration until further notice; the data bit locations will change to a predefined format until further notice; a custom configuration created by the user will be in effect until further notice; or future phase information will represent additional data bits for the symbol until further notice.

The number of data bits represented by this channel will be configuration dependent, e.g., depending on division of the phase channel into four possible values, 45, 90, 135 and 180 degrees of shift. In this use case, the user can add two additional data bits per symbol, 45°=00, 90°=01, 135°=10 and 180°=11. These bits are detected and added to the data transmitted on the ATM channel during the same symbol. Obviously, more possible phase values allow for more data bits.

This channel may also be used as a means of syncing the data being transmitted with a specific shift representing the beginning or end of a data byte, word or even packet. This allows for more actual data payload efficiency by not requiring the extensive preamble control bits to be sent to coordinate the transmission as in other modulation techniques Implementation of these various features can create customized proprietary protocols or to satisfy unique application requirements. This capability creates additional benefits in the effective data rate of the system utilizing this technique.

Figure 5:
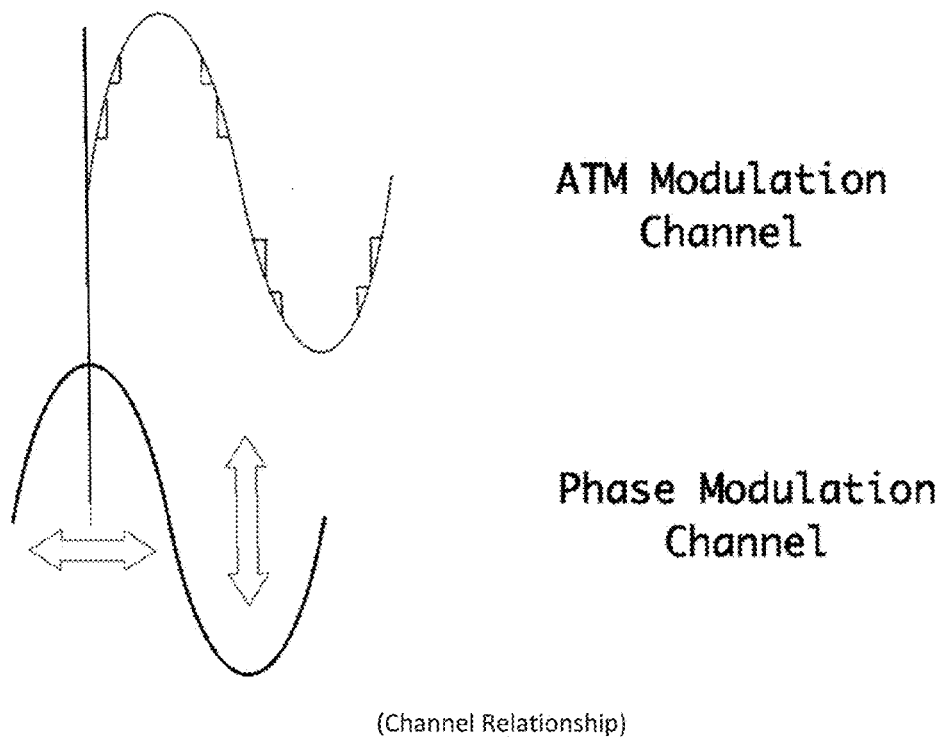
FIG. 5 illustrates the relationship between the ATM channel and phase modulated channel signals.

With reference to FIG. 5, the relationship of the ATM and Phase Channels is illustrated in which the Phase Channel is in quadrature (90 degrees out of phase) with the ATM Channel. The values of these two waves are independently encoded. The combination of phase and amplitude characteristics of the Phase channel reflects the data/control information for the given symbol.

Figure 6:
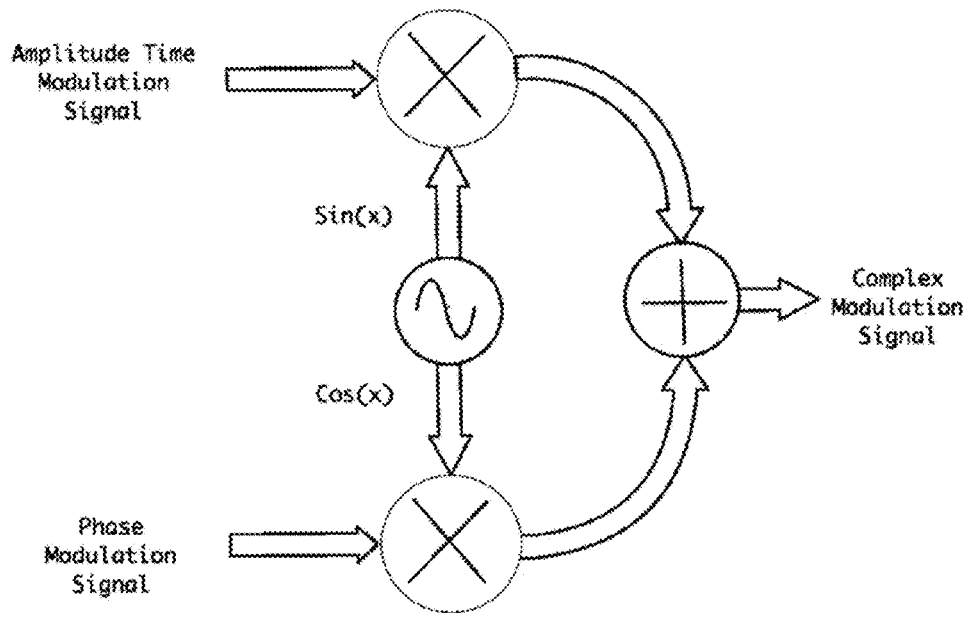
FIG. 6 illustrates a combiner for combining ATM and phase modulation signals.

With reference to FIG. 6, the combined data value of the symbol encoding is referred to as the complex Modulated Signal. FIG. 4 represents the two channels being created by the technology. The top channel is the ATM (Amplitude Time Modulation) channel. This is the primary data channel. This uses the presence or absence of the modulation described in FIGS. 1, 2 and 3 to encode 1 to n data bits per symbol on this data channel.

The bottom channel is the Phase Channel. This channel adds either additional bits and/or control bits to the technology. The phase and/or amplitude of the Phase Channel is modulated to represent the desired information, or data bits, to be encoded on the signal. This combination of phase and amplitude modulation is used to represent n number of values on this channel. The number of bits per symbol on this channel is limited only by the ability of the transmitting and receiving circuitry to respond rapidly enough to create and recognize the data values being encoded/decoded.

The two channels are in quadrature with each other or, in other words, 90 degrees out of phase with each other. The combining of these two signals creates the complex signal that contains the transmitted data and/or controls from the transmitting device to the receiving device.

In some implementations, data may be encoded solely in the ATM channel, i.e., with a 0° phase shift or 0 bits of data on the Phase Channel.

Turning now to description of implementations of transmission of the Phase/Amplitude-Time Modulated Signal, the modulated sine wave is sent to a gain block to produce a harmonic component, e.g., at the 3 dB compression point. The block acts as a soft mixer, mixing the data rate and the sine wave carrier rate to produce energy at the 3rd, 5th, and 7th harmonics of the carrier.

Another unique feature of the Phase/amplitude-time technology is that a signal may be transmitted using primarily the harmonic and its AM and PM components. The generated signal energy is put through a band pass filter centered at the harmonic component frequency. All but the harmonic is filtered out, as this is the spectrum having the AM and PM saw tooth energy components necessary to recover the transmitted information. These components are complementary to each other and symmetrically opposite to each other in the same time slot.

Conventional forms of modulation in use today are typically in-band or sideband energy producing, i.e., the energy produced is in the channel along with the noise and other byproducts produced. This typically causes a reduction in the SNR or Eb/No.

In contrast, Phase/amplitude-time modulation produces little to no in-band noise products since it uses primarily the energy in the harmonic portion of the spectrum. All the sideband and carrier energy is removed with the band pass filter centered at the harmonic frequency. For example, if the carrier frequency is 100 kHz and has 9 bits (or steps) per vertical slope, the data rate will be 18 times the carrier rate or 1.8 Mb/s. A Gaussian distributed concentration of energy is produced at the harmonic frequency and has a unit value amplitude and phase, crossing at the bit rate. This energy is then demodulated with a DSP (Digital Signal Processing) engine or an equivalent circuit implementation that is configured to act as a phase and amplitude detector for both the ATM and Phase channels.

The theoretical noise floor limit, known as kTB, for 100 kHz is −124 dBm at room temperature, but the peak power of the data is practically −70 dBm. This produces SNR of greater than 50 dB RMS.

Note: This data rate would normally require an Eb/No of near 100 dB for a BER of 10e-8. However, since Phase/amplitude-time produces no in-channel noise or artifacts and sends only the difference data bits, it takes less than 70 dB Eb/No.

Turning to description of reception of Phase/amplitude-time modulated signals, the harmonic carrier, i.e., the harmonic itself, plus the energy associated around the carrier, is input into a quadrature detector. This can be done using a pair of double balanced mixers with a 90-degree phase shift in the local oscillator, creating an IQ demodulator. Locking the local oscillator on the harmonic divided by value of the harmonic, we now have time-slot data information coming out of the quadrature and incident ports of the double balanced mixers, or IQ demodulator. When the phase and amplitude components cross each other a "1" or "0" is output depending on whether the data has been inverted.

Another way to configure a detector is to take the original frequency of the carrier wave, input it into a double balanced mixer, and input another sine wave without data in the local oscillator port at the same frequency. This configuration serves as a differential detector since the data output of the double balanced mixer is the difference between those two carriers. Thus any phase shift or amplitude shift in either one of those carriers can be used to produce a data stream. The carriers and sideband components can be discarded, reducing noise and spectrum requirements. In this implementation, only the harmonic distortion component for the first group of carriers is used. If more than one sine wave is passed down stream, only one is used as the clock, e.g., usually the top or bottom sine wave.

In a multi-channel environment, only one of the harmonics is sent. As long as the signals all begin at the same phase, one signal can be used for a frame clock for all channels as in ATM modes when the signals are again phase coherent. Phase/amplitude-time thus is more efficient moving from single channel to multi-channel use.

One of the primary advantages of Phase/amplitude-time technology is the capacity to communicate more information than current technologies in a given bandwidth. Currently, commercially available forms modulation can achieve around 10 bits per Hertz over existing, industry-standard infrastructure. Legacy modulation technologies often sacrifice bit error rate to increase information rate per Hertz, with industry standards requiring about 10 to the minus 8, bit error rate (BER 10e-8).

Figure 7:
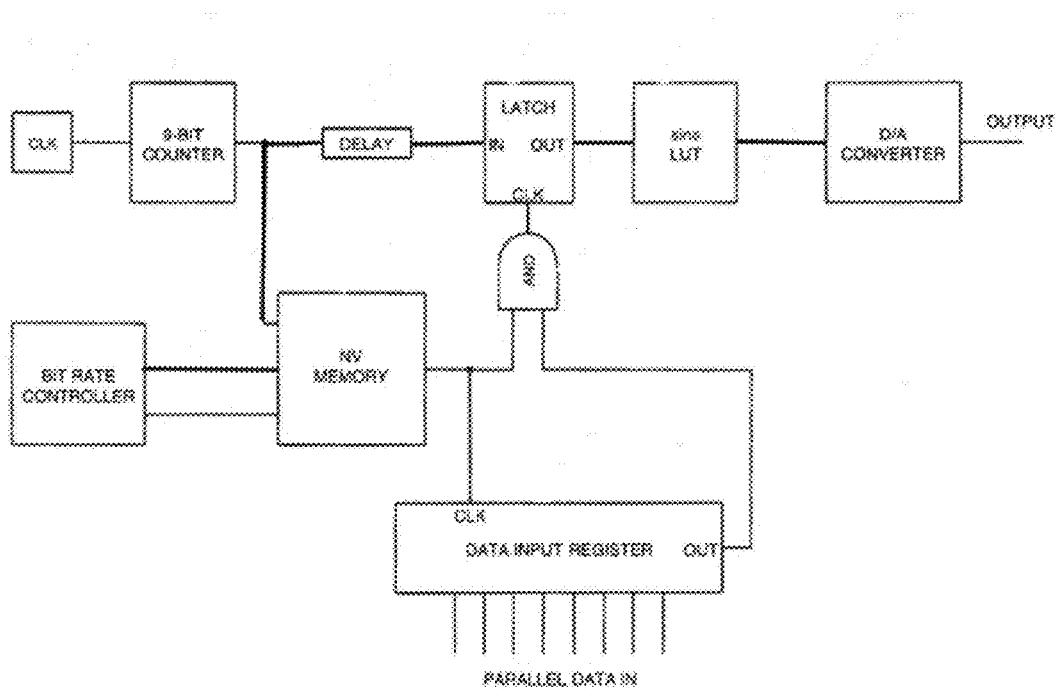
FIG. 7 illustrates block diagram of a typical modulator circuit for generating a modulated sine wave carrier signal.

FIG. 7 is block diagram of a typical modulator circuit for generating a modulated sine wave carrier signal. The displayed block diagram is the functional basis for implementing amplitude-time modulation. While classical block functions are shown other signal processing techniques such as programmed micros, digital signal processors, state machines are also appropriate to this task. The sine wave look up table (LUT) drives a D/A converter. The phase angles 0 to 360 degrees are quantized to n number of discrete values. A multi-bit counter continuously counts through these discrete values at a clock rate. The output of the multi-bit counter addresses the sine-function lookup table that provides the digital encoded sine-function value for each quantized phase angle. The D/A converter outputs a voltage proportional to the sine of the discrete phase angle at the input of the lookup table. The clock generator is shown driving the multi-bit counter with a delay element and latch the value when high being transparent when the value is low. The output drives the lookup table. The lookup table drives the D/A converter. Modulation implementing the step-porch amplitude-time modulation techniques by holding input to the lookup table for the desired number of clock pulses equal to time interval implementing the phase period desired.

Information to be encoded is introduced to a data input register. Data input size is n depending on device hardware and clock speeds. The data input register is clocked by the memory. The data are preloaded and initial data bits appear on the output (serial) of the data input register. If the counter and data input register as they appear at the And function both contain a value of 1 the output of the D/A converter will remain constant. During operation the counter continues and the output sequentially addresses the contents of the memory. D/A output will only change when a difference in value between counter and register are detected. Many variations can be employed to implement the encoding of digital information that minimizes signal distortions while maximizing data throughput. The bit rate controller can be adaptively configured to alter the bit rate or phase intervals to adapt to the communication channel conditions. Additionally, the bit rate controller can be adapted to implement security and control functions for the data transmission.

Figure 8:
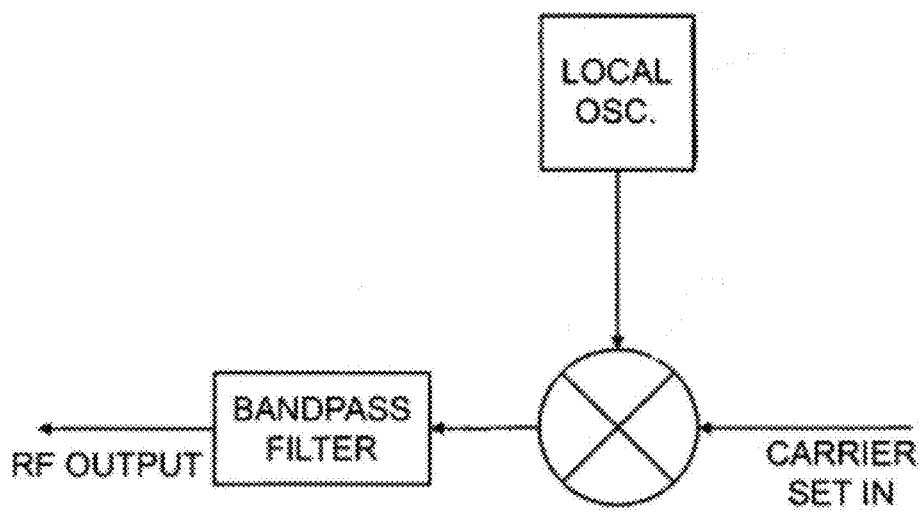
FIG. 8 is a block diagram of a typical frequency up converter for communicating a sine wave carrier signal.

FIG. 8 is a block diagram of a typical frequency up converter for communicating a sine wave carrier signal. A local oscillator drives one input of a balanced mixer. A modulated sine wave carrier set is mixed from the other input of the balanced mixer. The output of the balanced mixer is connected to a band pass filter. The output of the band pass filter is ready to be transmitted through the appropriate driver circuitry.

Figure 9:
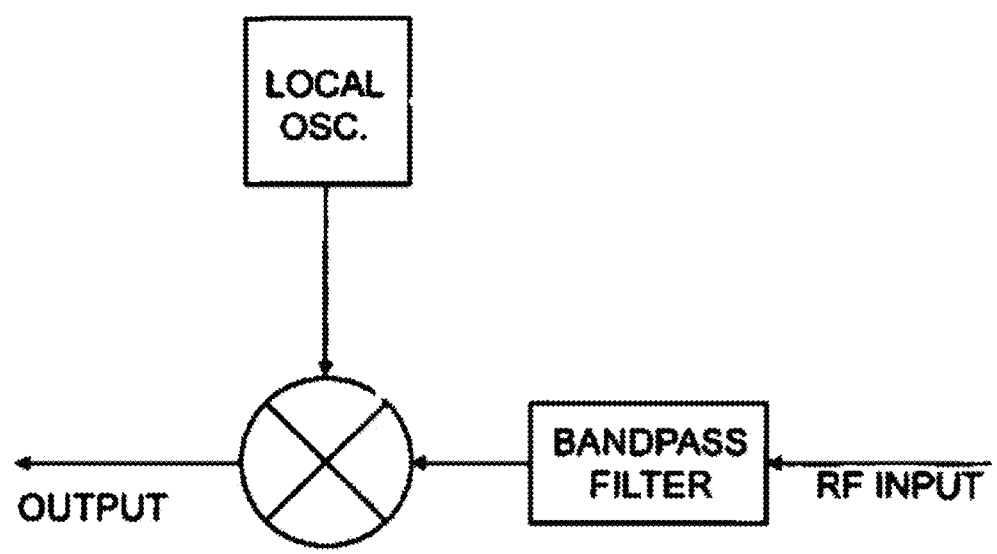
FIG. 9 is a block diagram of a typical frequency down converter for communicating a sine wave carrier signal.

FIG. 9 is a block diagram of a typical frequency down converter for communicating a sine wave carrier signal. A local oscillator drives on input of a balanced mixer. Received RF input is mixed into the other input of the balanced mixer. The output of the balanced mixer is passed to a detector for deciphering and conditioning.

Figure 10:
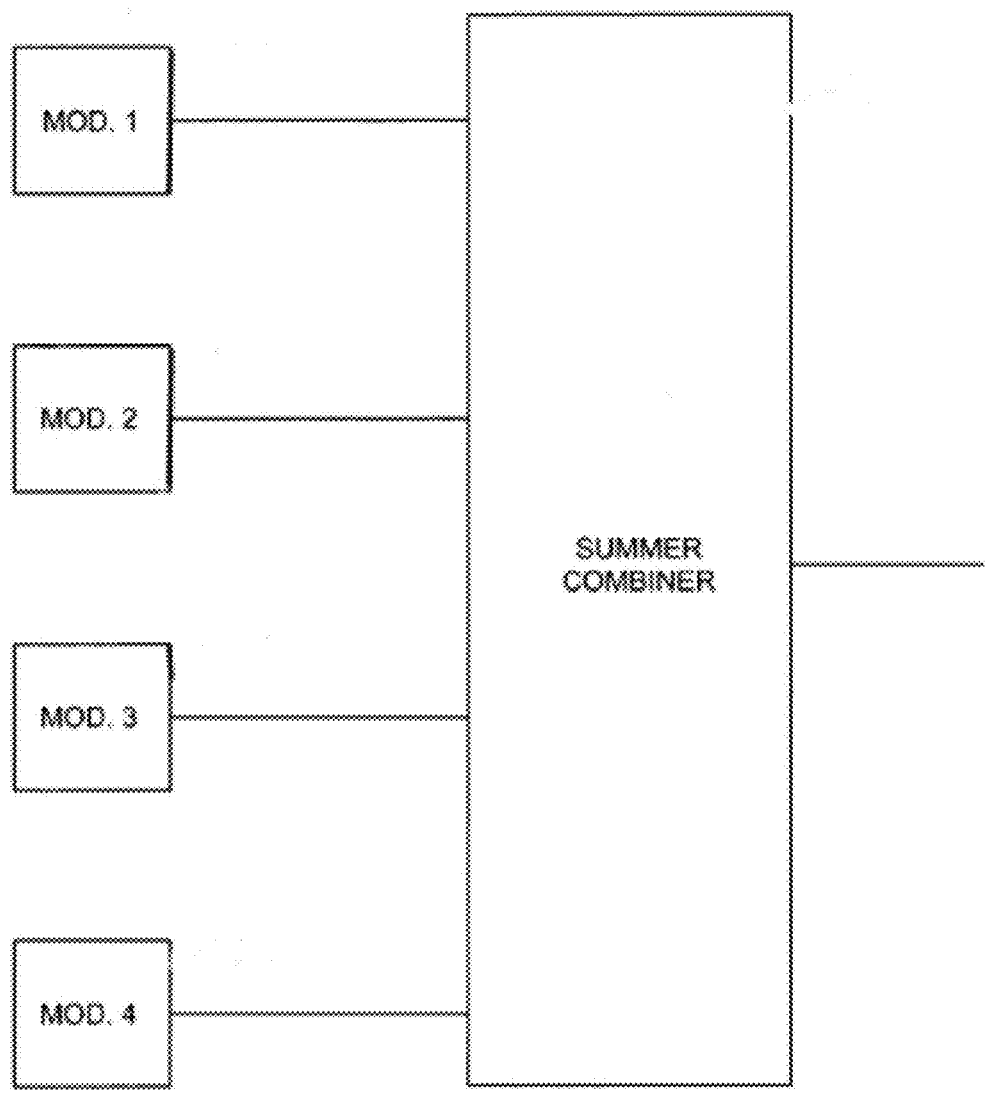
FIG. 10 is a block diagram of a typical modulator circuit, featuring individually modulated sine wave carriers with outputs mixed together to form a compound signal wave.
Figure 11:
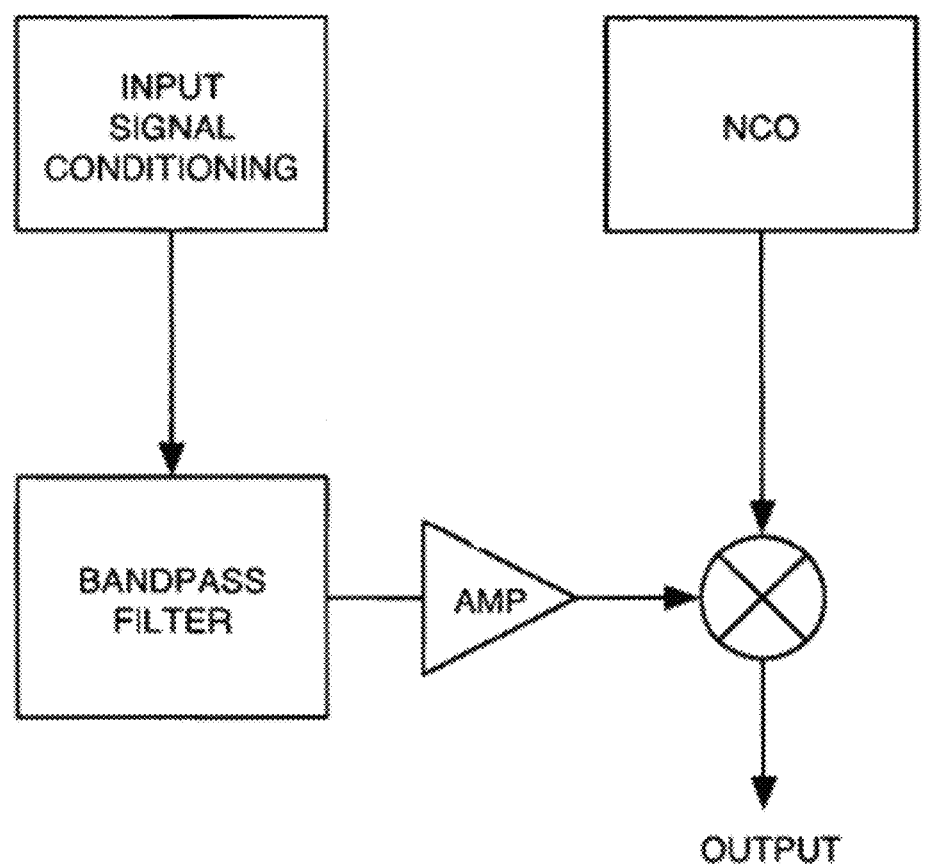
FIG. 11 is a block diagram of a typical demodulator circuit for extracting encoded information from a modulated sine wave.

FIG. 10 is a block diagram of a typical modulator circuits, featuring individually modulated sine wave carriers with outputs mixed together to form a compound signal wave. As shown a modular circuit(s) (MOD.1, MOD.2, MOD.3, and MOD.4) represent amplitude-time modulated sine wave carriers. These modular circuit(s) are fed into a summer/combiner for mixing into a composite waveform for conditioning, transmission and receiving/deciphering. The summer/combiner outputs are connected in serial or parallel to a data convoluter for transmission. The positioning of variable sine wave carriers can be varied by lists, look up tables, or software control as shown in FIG. 4 and FIG. 11. While 4 modular circuits are shown up to n circuits may be employed limited only by hardware device architecture, and clock speed.

The FIG. 11 is a block diagram of a typical demodulator circuit for extracting encoded information from a modulated sine wave. Initially, incoming modulated sine wave carrier is input to the input signal conditioning block. Various signal conditioning functions will be utilized within the signal conditioning block as appropriate to the type of transmission. Types of transmission include but are not limited to twisted pair, wireless, microwave, or differential lines. The output of the signal conditioning block is connected to a bandpass filter. The bandpass filter is typically centered on the carrier frequency with a Q>100. The signal from the bandpass filter is amplified by the Amp block and inserted into the balanced mixer block. The mixer block mixes the amplified signal with a numerically controlled oscillator, NCO block. The numerically controlled oscillator frequency and phase are set to the frequency and phase of one of the amplitude-time modulated sine waves within the passband of the bandpass filter.

Figure 12:
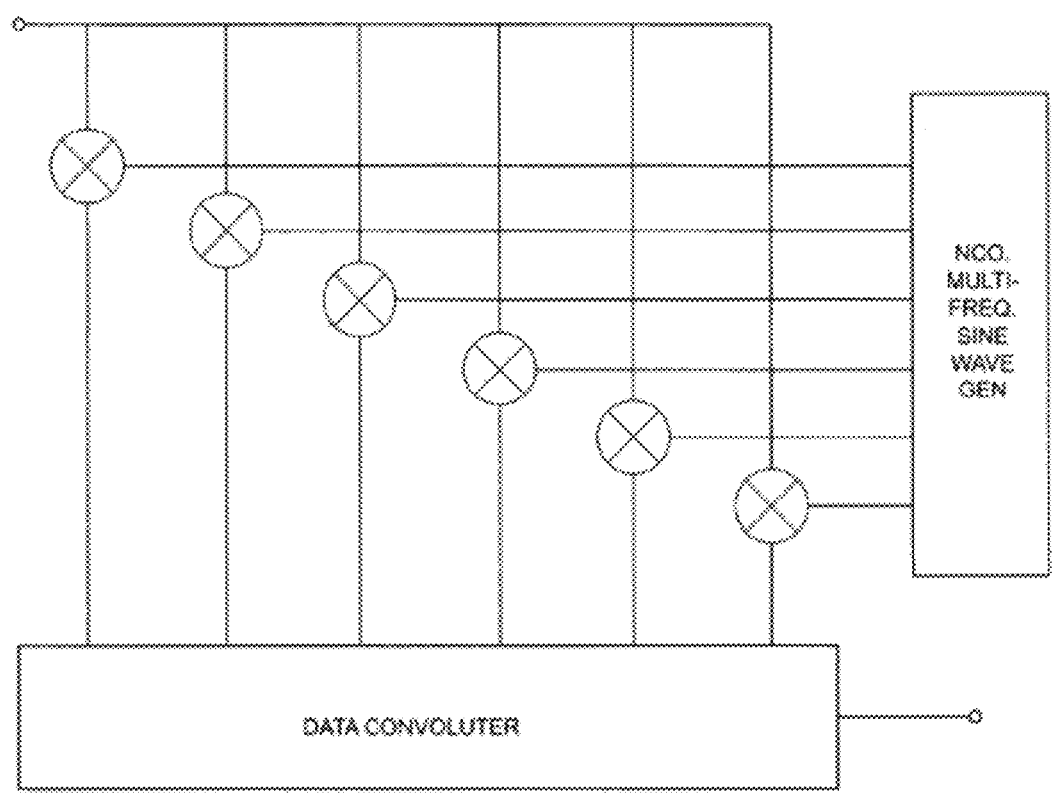
FIG. 12 is a block diagram of a typical demodulator circuit with n-multiple phase modulation streams.

FIG. 12 is a block diagram of a typical demodulator circuit with n-multiple phase modulation streams. Shown is a plurality of modulated carriers within a communications channel with separate demodulation of each carrier to decipher the encoded data. A collection of six balanced mixers are shown but n mixers can be implemented with the limitation of hardware device architecture, and clock speed. The input line(s) feed all balanced mixers. Each balanced mixer has a unique connection to a numerically controlled oscillator multi-frequency sine wave generator. The generator's output lines transmit at the specific frequency of the carrier wave data are to be extracted from. The mixer(s) output is the information from the carrier wave and is also connected to a data convoluter. The data convoluter reassembles the digital data from the individual amplitude-time modulated sine wave signal(s). The incoming carrier waves can be of different frequencies and data rates by utilizing adaptable control information.

Figure 13:
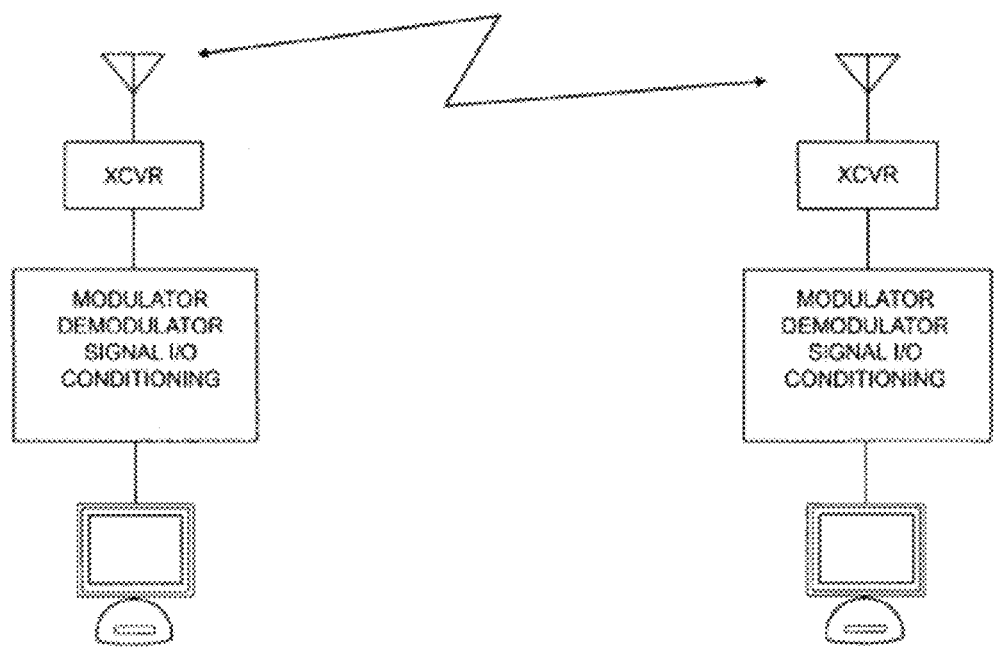
FIG. 13 is a drawing of a typical classical transmit/receive communication system with amplitude-time encoding.

FIG. 13 is a drawing of a typical transmit/receive communication system with amplitude-time encoding. As an example a RF wireless communications end to end block diagram is shown. Each station has a user interface for controlling communications functions. Additionally, each has a modulator/demodulator function for encoding/decoding of signals. Also, each has a transceiver to modulate/demodulate the carrier signals to be transmitted/received. Any final stage conditioning and transceiver function is appropriate to the modulation communications techniques.

Figure 14:
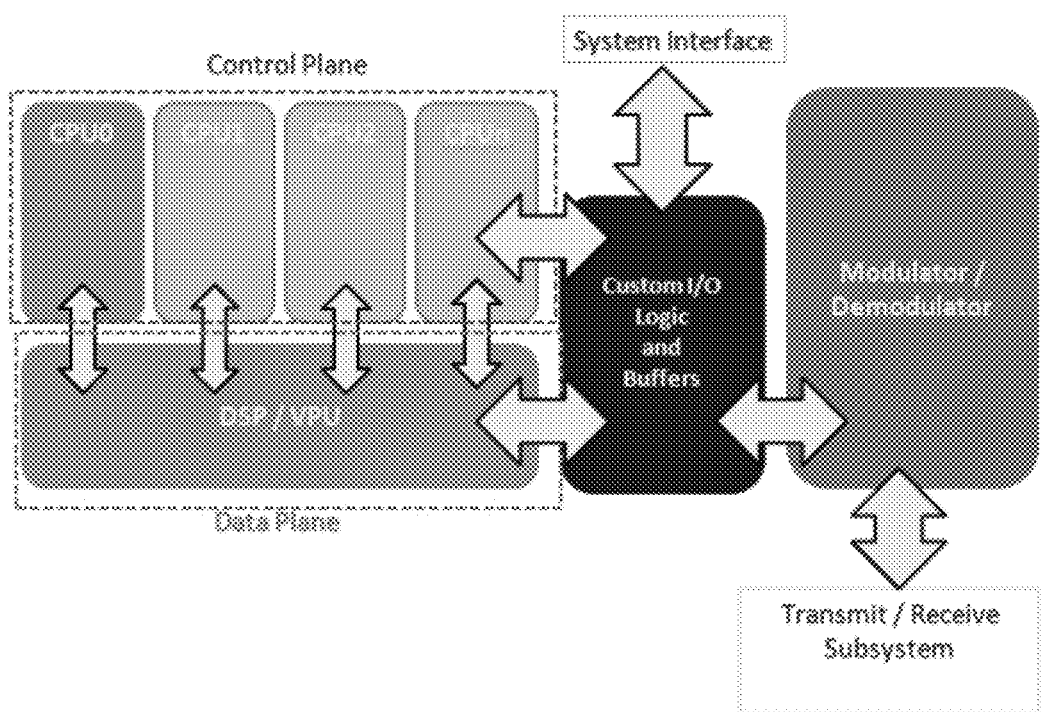
FIG. 14 is a block diagram of a typical interface circuit for implementing a software configurable method for generating a compound signal wave.

FIG. 14 is a block diagram of a typical interface circuit for implementing a software configurable method for generating a compound signal wave. The present block diagram is a hardware function that can be software configured to adapt to most any communications system. The interface circuit is implemented with a control plane that is a collection of CPUs (number n) interfacing with the I/F signal controlled by a GPU. The GPU represents the data plane and operates the transform receive and transmit functions. The control plane and data plane interface to a FPGA that contains custom I/O logic and buffers. The FPGA also facilitates a system interface. The FPGA also interfaces to the modulator/demodulator for signal transmission preparation. The modulator/demodulator also interfaces to an RF interface for signal transmit and receive functions. The illustrated CPU/GPU implementation may be replaced with a Digital Signal Processor (DSP) that is programmed to perform the same functions.

An important specification in any modulation technology is the Signal-to-Noise Ratio (SNR). This is the required signal strength, measured in decibels (DBs), above the ambient noise and often stated in relationship with the BER realized at that level. In other words, with a given signal strength above the noise, the modulation technology can reliably produce a specific BER.

Symbol Error Rate (SER) takes into consideration the number of bits per symbol. A stronger signal may be required to produce a lower BER. In the case of 256 QAM, this would be 8 Bits per symbol, so the SER is calculated by dividing the BER by the 8 bits per symbol. The more complex modulation schemes are typically more susceptible to noise. Thus, the signal must be increasingly higher than the noise in order to be reliably detected and correctly interpreted. When the receiver incorrectly interprets the transmitted signal, it can implement a forward error-correcting algorithm in software based on the error detection and correction scheme being used or it can request that the transmitter resend the data. Both of these options can negatively affect the performance of the network that is relying on the technology. Thus, it is advantageous to produce the lowest BER at the smallest possible SNR.

While QAM (QAM16, QAM64 up to QAM1024) is currently considered the best conventional modulation, its inherent limitation is that QAM generates artifacts and noise in the channels. With QAM, any attempt to increase the signal to noise ratio by amplifying the signal, amplifies the noise by the same factor. Therefore, Shannon's Limit is always reached. In summary, the smallest QAM step generally has to be greater than 6 dB above the noise in the channel. If there is noise in the channel, it is necessary to amplify the signal before encountering the noise. In fact, QAM's limitations also apply to other existing forms of modulation, as they also use in-band, sideband, or related-component types of modulation.

Amplitude Modulation (AM) is in-band and has two side bands, although the carrier is not needed, so the carrier and one of the side bands are filtered out in the receiver, leaving only a single sideband to provide transmitted information. While Frequency Modulation (FM) has some advantages in terms of immunity to noise, it does not conserve spectrum.

QAM is generally considered superior to PCM, BPSK, AFSK and other forms of modulation. QAM employs quadrature movement of the sine wave and an amplitude step of each sign wave. Depending on the rate of the sign wave, there is an AM component shifted forward or backward in phase with an in-band noise generating effect. Besides the movement of the sign wave, which generates FM or PM, QAM employs an amplitude step with its own artifacts. These two elements combined generate random noise inside the channel. Thus, conventional modulation schemes employ sidebands or other artifact-generating data transport methods.

For example, an AM radio frequency of 1 MHz transmitting music, it is possible to use up to half of the 1 MHz, or 500 KHz, without breaking Nyquist limits. If we exceed that, there would be no spectral difference between the information we are sending and the carrier we are sending it on. If that limit is exceeded, sideband products are generated.

In contrast, Phase/amplitude-time modulation discards or filters out the carrier, sidebands, and in-channel extraneous elements prior to transmission. Thus, Phase/amplitude-time modulation can break the Nyquist limit when more than 16 steps are modulated onto the sine wave. With Phase/amplitude-time, using the same 1 MHz carrier, it is feasible to support a 16 Megabit per second data rate, surpassing the Nyquist limit (e.g., modulating a 16 MHz carrier within 1 MHz). However, this is not a carrier at 16 MHz but a data stream. The data stream can be one of several types of frequencies, e.g., 101, 001, and 010, with additional combinations up to the channel width limit.

In a particular embodiment, a Phase/amplitude-time sine wave is synthesized using a 100 KHz carrier and a numerically controlled oscillator (NCO). A D to A converter is used to set the bit step-size, e.g., to the least significant bit or the next to least significant bit. Selective toggling of "ones" "zeros" generates steps or porches in the sine wave, referred to as ATM. Thus, the steps or porches represent either "ones" or "zeros" generated in every other bit location, and every other timeslot location, so each timeslot is different. These steps and porches are typically only generated on the more vertical parts of the sine wave. For example, in the case of a 1 MHz sine wave there can be 16 steps, 8 bits on each of the more linear portions of the vertical slopes.

Figure 15:
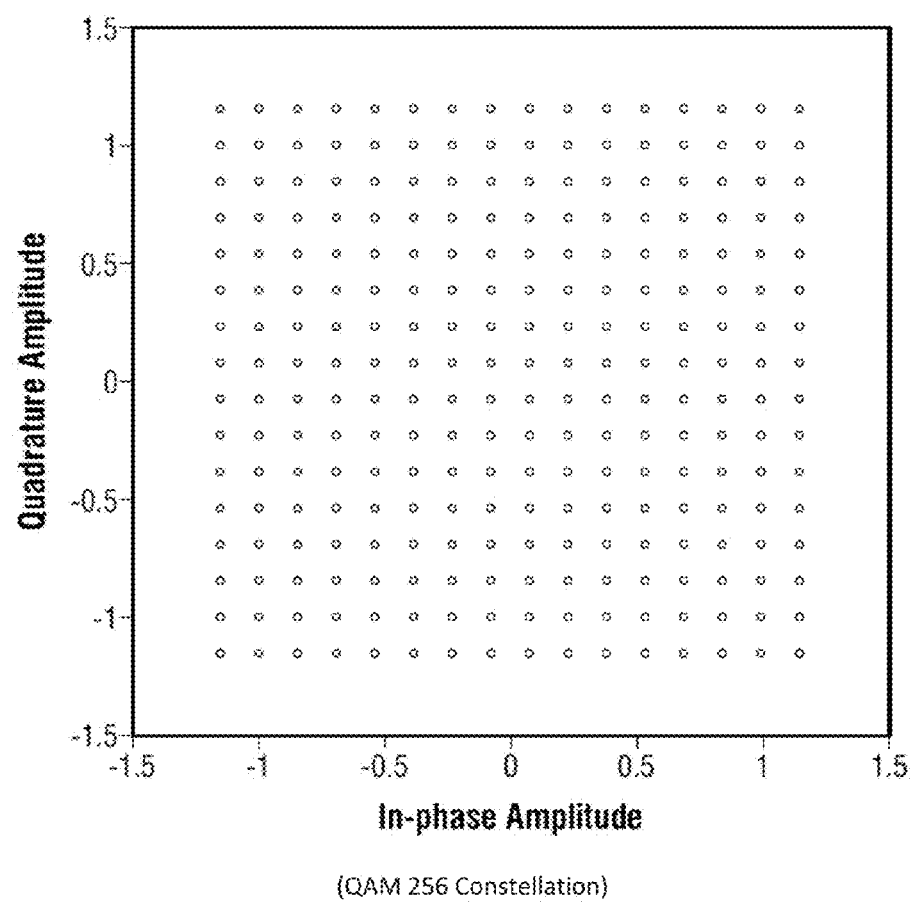
FIG. 15 illustrates a prior art QAM 256 constellation.

The Phase/amplitude-time ATM Channel, with only 8 bits per symbol, is equivalent in data throughput to QAM256. Again, the data transmitted using the ATM Channel is the actual value of the data, requiring only one modulated wave, and not a representation of the data as in QAM256, which requires two modulated waves to convey the same data value. FIG. 15 illustrates a QAM256 "constellation" in which each point in the constellation represents an eight bit binary value between 0 and 255.

Figure 16:
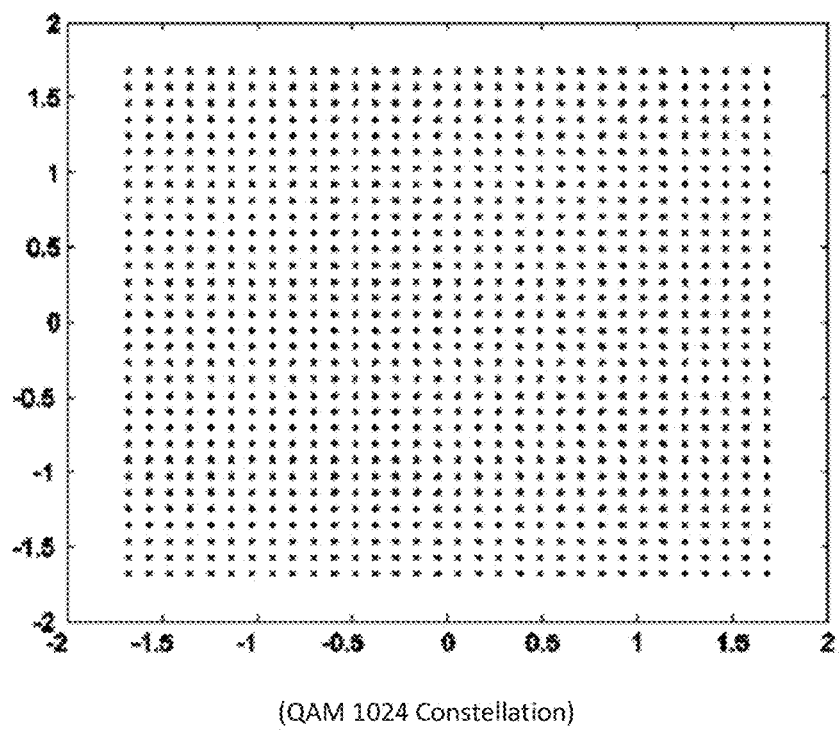
FIG. 16 illustrates a prior art QAM 1024 constellation.

With reference to FIG. 16, each quadrant of a QAM 1024 constellation map contains 256 points. The challenges that exist with QAM 256 become even more pronounced with QAM 1024. For example, accurately identifying an intended point on the constellation and determining its exact data value requires that two waves be accurately measured and interpreted at the symbol frequency. Accuracy is critical to maintain the BER or SER of the system, to reduce receiver processing, or worse and avoid the need for data retransmission.

In a particular Phase/amplitude-time use case, the Phase Channel is used to designate one of four values, provide increased data throughput. This use case leveraged the reliable data transmission characteristics of the ATM Channel and implements Phase Channel data to quadruple (4×) the effective data throughput. Analogous to QAM 1024, the value on the Phase Channel is associated with a quadrant, except that the actual data value is encoded on the ATM Channel wave, while the Phase Channel designates the "quadrant" location on the "constellation."

Figure 17:
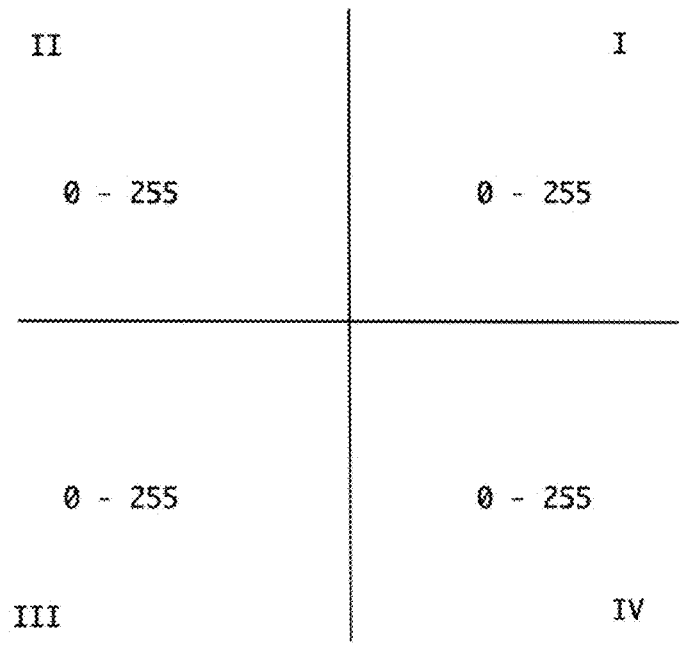
FIG. 17 illustrates an implementation of the phase channel to designate the quadrant value and the amplitude-time channel to provide an 8 bit data value for each quadrant.

With reference to FIG. 17, a QAM 1024 equivalent throughput implementation of Phase/amplitude-time could be envisioned as a superior solution. This is similar to QAM 1024 but with the benefits of the Phase/amplitude-time modulation. This use case underscores the power that the Phase Channel brings to the ATM Channel by encoding just two bits of data on the Phase Channel and only 8 bits per symbol on the ATM Channel, a QAM 1024 equivalent data rate can be realized with Phase/amplitude-time modulation. In addition, the improved SNR and spectral utilization of the Phase/amplitude-time modulation is maintained. Phase/amplitude-time throughput can be proportionally increased by adding additional bits to the Phase Channel.

These Phase Channel values can also be looked at as "channels" for the ATM data. In other words, three bits of Phase Channel data results in eight unique "channels" for the ATM data.

The ATM Channel signal is sent into a gain block and the input to the gain block is adjusted to achieve the compression point of the peak-to-peak value of the sine wave. The compression point is the non-linear portion of an amplifier where, as the input signal is increased, the output does not follow the input level. While Phase/amplitude-time technology is currently capable of using any one of the 32 harmonics, it is described herein with a focus on the third harmonic. The compression point of interest is the point where the entire third harmonic carrier and component information is located. Therefore, if the number of steps has distorted the sine wave by 30-40 dB, a third harmonic carrier 30 dB down from the fundamental frequency carrier amplitude will result. The input to the gain block is further adjusted so that the associated step components are equal to the sine wave at 3 times the carrier rate.

Adjusting the compression point described above within the amplifier (e.g., to about 2 or 3 dB of linear compression), the third harmonic can be used as a clock. The components around the third harmonic are the resulting data symbols. The Gaussian distributed concentration of energy (or data in this case) is equal in amplitude which can be advantageously used to optimize the Eb/No ratio, i.e., the signal energy in the bits over the noise floor. The steps of the Phase/amplitude-time sine wave represent two components, amplitude and phase. When those two components cross they appear as Fourier components around the third harmonic with a Gaussian distribution.

In conventional modulation, like FM transmission, the modulation rate of the signal is the frequency offset of the carrier being sent. The amount of deviation in frequency is the volume of the modulating signal. In phase modulation a carrier deviates in phase based on the modulating signal. With Phase/amplitude-time, using the harmonic, there is not a volume component, only the rate that is no longer in the channel spectrum, which results in a channel clear of modulation-produced noise.

The phase component, which is part of the energy of the Fourier component, is not being sent, and therefore, does not require spectrum. In the Phase/amplitude-time modulation scheme, only the amplitude step requires spectrum around the harmonic. Phase can be recovered in two ways. The first method is by quadrature detection of the amplitude component. Locking onto the harmonic, the correction for the lock also produces the phase component. When the amplitude and the phase cross a data bit is output in the detector.

With Phase/amplitude-time, there is only one amplitude step without fractional components that produce energy down to the noise floor. For example, a 100 KHz signal with 16 steps per sine wave would result in 1.6 Mb/s of data running through an 85 KHz channel (KTB for 85 KHz is negative 125 dBm). Therefore, transmitting that signal at "0" dBm, a signal-to-noise ratio of 125 dB is obtained.

Comparing Phase/amplitude-time to other modulation schemes, using Shannon's limit, Phase/amplitude-time produces a channel clear of in-band artifacts, having a data capability considerably more than would normally be sent, such as our 1.6 Mb in an 85 KHz channel. As a result, Phase/amplitude-time has a much greater signal-to-noise ratio than any other form of modulation.

Phase/amplitude-time modulation offers a level of immunity to noise because the amplitude and phase components are being sent in quadrature to each other. It is the crossover point of those two components that are detected for data in the ATM Channel. Since noise does not shift in phase, typically the noise threshold itself can be approached, with approximately a 2 dB signal-to-noise ratio, and still detect the data. Other conventional forms of modulation may require more than a 12 dB SINAD or 6 dB signal-to-noise for equal bit error rates (BER). Significant data corruption requires resending data multiple times to achieve a usable BER such as 10e-8. Noise in the channel typically reduces the signal-to-noise ratio, including the factors of noise floor kTB, insertion loss, amplifier noise, and the various artifacts produced. Thus, the usable signal power cannot be raised without also raising the noise in the channel.

However, since Phase/amplitude-time sends only the transient components, they can be sent at a very high level, resulting in a large Eb/No ratio, e.g., data can easily be detected even when the SNR is only 2 dB Eb/No.

The third harmonic can carry three times the phase data, generating as a digitally synthesized oscillator at the fundamental. The oscillator will generate distortion while generating the sine wave, depending, e.g., on the frequency of the clock, step size, and how monotonic the D to A converter is (whether it is an R2R ladder or other type). With an 8-bit R2R ladder or D to A converter, 160 dB per Hertz from the oscillator can be achieved at 10 kHz from the third harmonic carrier frequency.

In the typical case, the third harmonic has some random sideband and numerical noise, but it is 160 dB down at 10 KHz from the third harmonic carrier frequency. This is below the threshold of the amplitude of the Fourier components at the third order intercept point (IP3). As a result, the third harmonic noise is not a factor.

Turning now to description of multi-carrier effects, most advanced modulation schemes are used in multi-carrier environments, where noise is generated from many sources. Nevertheless, Phase/amplitude-time substantially maintains noise immunity whether from transmitting its own data or from crossover noise generated by other carriers. However, some forms of modulation like Pulse Code Modulation (PCM), PSK31, AFSK and various others have non-return-to-zero components that can occasionally interfere with the time slot Phase/amplitude-time is trying to receive. For example, in the case of television frequencies with many headroom components and other artifacts in the channel, there may be interference encountered at the rate of Phase/amplitude-time's phase, causing the bit error rate to degrade. However, it is estimated that the maximum incidence of these events is about 16%, because Phase/amplitude-time's Gaussian concentration of energy is 68% of the total energy. The remaining 16% is outside the complementary area of that part of the Gaussian concentration of energy. Statistically, the most interference Phase/amplitude-time could encounter would be 16% of the total time. Therefore, Phase/amplitude-time's noise immunity is extremely good.

The component energy being used is not generating additional noise in that portion of the spectrum around the given harmonic. There are also inter-modulation distortion components and other sideband-producing noise elements that are eliminated with a channel band-pass filter.

In a particular example, if a band-pass filter has a 100 KHz pass band for transmission at 1.6 Megabits in a 100 KHz channel, a Signal-to-Noise (SN) ratio of approximately 80 dB is required based on Shannon's limit. With a theoretical noise floor of −124 dBm, the minimum signal power would be only −44 dBm with Phase/amplitude-time. If necessary, the 100 KHz channel bandwidth can be reduced and increasing the signal to noise ratio from 10 dB to 20 dB results in double the data rate usable in the channel.

Again, when using the third harmonic, Phase/amplitude-time essentially discards the fifth and seventh harmonic data and the two sidebands generated at one of the three frequencies where the data may exist, plus or minus the carrier frequency used. Although two concentrations of energy exist, they are not transmitted because they are filtered in the transmitter. These would simply add unnecessary energy to the channel and are not needed The Phase/amplitude-time signal is a single amplitude that can be transmitted at any desired power level. This is the energy associated with the harmonic. If random data is transmitted, it is a Gaussian concentration of energy (sine x/x), which can be placed on either sideband, or in the center of the third harmonic. This is accomplished by the symmetry of either the porches or steps during generation of the sine wave. Preferably, the energy concentration is placed on the high-frequency side of the harmonic carrier, with time coherence between the energy, amplitude, and carrier being sent. The amplitude of the harmonic carrier is a function of the total distortion of the sine wave itself, so it is not necessary to transmit that either for detection in the receiver.

Phase/amplitude-time modulation provides the flexibility of using the least significant bit, the next to least, or other combination, to generate the step size on the sine wave. The wave can be paused, and the chosen bit toggled as necessary. In addition, a bit from a previous location can be toggled in the lookup table, in advance of the current location, so a step or a porch is created. This accommodates many possible combinations.

Thus, not only can the associated concentration of energy be maximized around the harmonic, it is also possible to alternate between data combinations and create two additional concentrations of energy. Multiple channel combinations of bits can be transmitted. Trinary, dual binary, and many other combinations are also possible. As an added security benefit, these combinations can be made very complex so they cannot be decoded without the proper key sequence.

A significant aspect of Phase/amplitude-time modulation is the conservation of spectrum. Phase/amplitude-time uses spectrum when sending a change in data value, which shows up in the harmonic as intermodulation distortion products. These are Fourier components that result in transmitted energy. Since only data changes are being sent, and typical data is random, only 50% of the normally required energy is necessary to transmit. Therefore, the total power spectral density required is half. If it is desirable to send every bit, every other bit may be inverted. As a result, nearly all of this data is symmetrical and it becomes a classic Gaussian distribution of energy around the harmonic. However, it comprises only one half of the bandwidth energy normally required.

As a test example, a 100 KHz sine wave, with a 300 KHz data third harmonic, was used to send 1.6 Mb of data in 85 KHz. Shannon's Limit can be estimated by: the log base2 of SNR is 0.332 times the SNR value expressed in dB. Assuming the SNR is 120 dB and ignoring the plus 1 and the numeric value, this value could be considered if the power level of the carrier were +30 dBm or one watt, as the resulting third harmonic carrier would be at approximately 0 dBm, and the theoretical noise floor would be −125 dBm. Converting the power ratio in dB to the numeric value and adding the plus 1, the result is SNR in dB times 0.332 times 85 KHz, which represents the total Shannon's limit given those parameters in Mb per second. In this case, it would result in 3.0101 Mbps. Dividing by 85 KHz, according to Shannon, the highest theoretical throughput possible would appear to be 35.41 bits per Hertz.

With a 30 dB amplifier, the channel has 120 dB of free dynamic range above the noise floor, and the noise in the channel is amplified by 30 dB. Subtracting 30 dB from 120 dB, the total SNR is reduced to 90 dB. Such factors compound and degrade the 39.84 bits per HZ to about 30 bits per Hz, e.g., the practical limit. While standard forms of modulation are severely affected by these factors, Phase/amplitude-time allows data transport without some of these limiting factors having a significant effect.

Phase/Amplitude-Time Receiver Implementations

One simple receiver structure is a direct conversion or zero if the receiver filtered to receive only the harmonic and its components. In the 300 KHz example, such a receiver would look for the real and quadrature imagined components of the phase. The receiver would lock on the third harmonic, divide by three, take the 2 outputs and check them for phase and amplitude where they cross. Since there is only one amplitude step size, the amplitude is a function of the power in the total energy concentration. If it is zero dBm, we would be detecting 200 millivolts. Noise would have to increase to 190 millivolts before it would interfere with data detection. The result is extraordinary noise immunity! The fact that the noise is not coherent with the data is also unique to Phase/amplitude-time.

Although not required, a cost-effective method of detection is a Digital Signal Processing (DSP) engine, which can provide more complex features with Phase/amplitude-time modulation/demodulation. A universal DSP engine for Phase/amplitude-time has been demonstrated for a range of applications.

IQ Demodulator Implementation

In some implementations, the receiver includes an IQ demodulator similar to those used in cell phones. The IQ demodulator can be used to set the clock divider by three and decipher time slots to determine when to look for data and when not to look for data. The DSP requires a math model to efficiently decipher data without wasting clock cycles. The IQ demodulator is an incident and quadrature detector that has a ninety-degree phase shift between two double-balanced mixers. The input signal drives the R ports of the double balanced mixers. The local oscillator is generated at the carrier rate of the third harmonic. The ports are in quadrature to each other.

As a result, when an output appears at one port, the quadrature image appears at the other port. One output represents phase and the other represents amplitude. Since they appear as opposite saw tooth waves, where they cross each other, complementary values result in a one that takes the form of a clearly defined amplitude or energy pulse. It is easily detectable, even when combined with impairments such as noise, aliasing, or other artifacts normally in the channel.

Receiver Band Pass Filter Requirements

In one implementation, the ATM Channel of the Phase/amplitude-time modulation technique utilizes an elliptical filter. Elliptical filters offer sharp, frequency cut-off, however, they are also characterized by group delay. This means not all frequencies pass through the filter with the same time delay. This group delay is a change in phase, depending on frequency, which is linear (logarithmically linear) with the frequency. Therefore, the filter is configured to minimize group delay to avoid upsetting the phase component that Phase/amplitude-time is trying to detect. As the number of bits received increases, group delay becomes increasingly important at the upper corner frequency of the filter.

At the upper corner frequency, the filter rejects frequencies above the cut-off frequency and accepts those frequencies below the cut-off frequency. This creates an impedance discontinuity that causes reflections measured as return loss. Return loss is the voltage ratio of the power being reflected and the power being accepted, such that the corner frequency wrinkles the phase component of whatever the transfer slope is. This condition creates distortion in the area Phase/amplitude-time in which is trying to detect the data components. So, both group delay and phase compensation of the group delay are important considerations. A well-constructed elliptical filter can effectively deal with the problems outlined above for Phase/amplitude-time applications.

A suitable communications system background is disclosed in more detail in the Drawings of U.S. Pat. No. 7,046,741 (now expired) issued on May 16, 2006 to inventor Forrest J. Brown et al. The subject matter of which is hereby incorporated by reference in its entirety into this disclosure.

An amplitude-time modulated compound signal wave modulator/demodulator will typically be configured as a classical communications transmit/receive system. Amplitude-time modulation techniques can also be a dedicated standalone communications transmit/receive system.

As will be appreciated, Phase/amplitude-time modulation provides a new method for communication of information that overcomes many of the challenges of conventional modulation methods. With this new modulation technology significant channel bandwidth and noise issues can be addressed. Phase/amplitude-time has been demonstrated to provide higher data rate, more efficient frequency utilization and greater immunity to noise effects.

Various alternative embodiments may include a use case for a satellite data modem, down-hole sensor communication for the oil/gas industry, cellular client and infrastructure communication, telephone and xDSL and a multitude of wireless and cable communication.

Similarly, while the present invention has been described herein as a signal modulation apparatus and means for data communication. The present invention may be readily used with any number of communication systems or other similar devices now known or hereafter developed.

Finally, while the present invention has been described above with reference to various exemplary embodiments, many changes, combinations and modifications may be made to the exemplary embodiments without departing from the scope of the present invention. For example, the various components may be implemented in alternative ways. These alternatives can be suitably selected depending upon the particular application or in consideration of any number of factors associated with the operation of the device. In addition, the techniques described herein may be extended or modified for use with other types of devices. These and other changes or modifications are intended to be included within the scope of the present invention.

What is claimed is:

1. A method for encoding digital data comprising:
    generating an amplitude-time modulated sine wave;
    generating a phase-modulated sine wave; and
    summing the amplitude-time modulated sine wave and the phase-modulated sine wave to generate a compound sine wave.

2. The method of claim 1, wherein modulation of at least one of the amplitude-time modulated sine wave and the phase-modulated sine wave serves to encode data within the compound sine wave.

3. The method of claim 1 further comprising applying guard bands at zero crossings and peak values of one or more of the sine waves.

4. The method of claim 1 wherein generating the amplitude-time modulated sine wave comprises at least one of holding and delaying an amplitude for a short period.

5. The method of claim 1 wherein encoding of data within the amplitude-time modulated sine wave approximates steps on the amplitude-time modulated sine wave.

6. The method of claim 1 wherein generating the compound sine waves comprises mixing the amplitude-time modulated sine wave and phase-modulated sine wave with a ninety (90) degree quadrature relationship.

7. A system for encoding digital data comprising:
    an amplitude-time modulator for generating an amplitude-time modulated sine wave;
    a phase modulator for generating a phase-modulated sine wave; and
    a summing module for summing the amplitude-time modulated sine wave with the phase-modulated sine wave to generate a compound sine wave.

8. The system of claim 7 further comprising a compound sine wave modulator for modulating the compound sine wave to encode data thereon.

9. The system of claim 7 wherein the amplitude-time modulator is programmable to select an angle where data bits reside on the amplitude-time modulated sine wave.

10. The system of claim 7 wherein the phase modulator is programmable to encode a control signal regarding interpretation of data encoded by the amplitude-time modulator.

11. The system of claim 7 wherein the amplitude-time modulated sine wave includes data encoded as a step in a wave signature of the amplitude-time modulated sine wave.

12. The system of claim 7 further comprising:
    an up-converter module for converting the compound sine wave for communication transmission;
    a transmitter for transmitting the compound sine wave; and
    a down-converter module for deciphering data encoded in the transmitted compound sine wave.

* * * * *